(12) United States Patent
Heltzel

(10) Patent No.: US 12,384,136 B2
(45) Date of Patent: Aug. 12, 2025

(54) COMPOSITE MATERIAL FOR PASSIVE RADIATIVE COOLING

(71) Applicant: PC KRAUSE AND ASSOCIATES, INC., West Lafayette, IN (US)

(72) Inventor: Alex Heltzel, Austin, TX (US)

(73) Assignee: PC KRAUSE AND ASSOCIATES, INC., West Lafayette, IN (US)

( * ) Notice: Subject to any disclaimer, the term of this patent is extended or adjusted under 35 U.S.C. 154(b) by 365 days.

(21) Appl. No.: 17/874,774

(22) Filed: Jul. 27, 2022

(65) Prior Publication Data

US 2022/0355577 A1     Nov. 10, 2022

Related U.S. Application Data

(63) Continuation of application No. 15/172,304, filed on Jun. 3, 2016, now Pat. No. 11,440,291.
(Continued)

(51) Int. Cl.
*B32B 15/08* (2006.01)
*B32B 27/20* (2006.01)

(52) U.S. Cl.
CPC .............. *B32B 15/08* (2013.01); *B32B 27/20* (2013.01); *B32B 2264/1021* (2020.08); *B32B 2264/303* (2020.08); *B32B 2307/30* (2013.01); *B32B 2307/40* (2013.01); *B32B 2307/416* (2013.01); *B32B 2311/08* (2013.01);
(Continued)

(58) Field of Classification Search
CPC . B32B 15/08; B32B 27/20; B32B 2264/1021; B32B 2264/303; B32B 2307/30; B32B 2307/40; B32B 2307/416; B32B 2311/08; B32B 2311/24; B32B 2419/00; Y10T 428/31504; H01L 23/3737; H01L 23/36
See application file for complete search history.

(56) References Cited

U.S. PATENT DOCUMENTS 3,043,112 A    7/1962   Head
5,234,985 A    8/1993   Koo
(Continued)

FOREIGN PATENT DOCUMENTS

| JP | 2011163715 A | 8/2011 |
|----|---|---|
| JP | 60086173 A | 6/2015 |
| KR | 101524728 B1 | 6/2015 |

OTHER PUBLICATIONS

International (PCT) Search Report and Written Opinion for International (PCT) Patent App. No. PCT/US23/80503 dated Mar. 13, 2024, 10 pages.
(Continued)

*Primary Examiner* — John D Freeman
(74) *Attorney, Agent, or Firm* — Barnes & Thornburg LLP

(57) ABSTRACT

A composite material for passive radiative cooling is provided. In some embodiments, the composite material includes a base layer, and at least one emissive layer located adjacent to a surface of the base layer. In some embodiments, the at least one emissive layer is affixed to the surface of the base layer via a binding agent. In some embodiments, the surface of the base layer comprises a reflective substrate comprising an adhesive layer. In some embodiments, the at least one emissive layer is affixed to the base layer via the adhesive layer of the base layer.

12 Claims, 4 Drawing Sheets

Related U.S. Application Data

(60) Provisional application No. 62/170,369, filed on Jun. 3, 2015.

(52) U.S. Cl.
CPC ....... *B32B 2311/24* (2013.01); *B32B 2419/00* (2013.01); *Y10T 428/31504* (2015.04)

(56) References Cited

U.S. PATENT DOCUMENTS

| | | | |
|---|---|---|---|
| 7,503,971 | B2 | 3/2009 | Butler |
| 2001/0044489 | A1 | 11/2001 | Hugo |
| 2004/0009319 | A1 | 1/2004 | Zanchetta |
| 2004/0185276 | A1 | 9/2004 | Hara |
| 2005/0064094 | A1 | 3/2005 | Wojtysiak |
| 2007/0110961 | A1 | 5/2007 | Fensel |
| 2008/0318031 | A1 | 12/2008 | Smith |
| 2012/0107625 | A1* | 5/2012 | Smith ............ C09D 7/70 427/256 |
| 2013/0288042 | A1 | 10/2013 | Haines |
| 2014/0131023 | A1 | 5/2014 | Raman |
| 2014/0233120 | A1 | 8/2014 | Kreling |
| 2015/0131146 | A1 | 5/2015 | Fan |
| 2015/0146287 | A1 | 5/2015 | Kuhlmann |
| 2016/0356561 | A1 | 12/2016 | Heltzel |
| 2017/0248381 | A1 | 8/2017 | Yang |
| 2018/0246261 | A1 | 8/2018 | Templin |
| 2019/0338415 | A1 | 11/2019 | Wrench |

OTHER PUBLICATIONS

Dictionary definition of "abrasive", Merriam-Webster, printed from the web: Oct. 3, 2018, url: https://www.merriamwebster.com/dictionary/abrasive.

Zhu, Linxiao, Raman, Aaswath, and Fan, Shanhui, Color-preserving Daytime Radiative Cooling, Applied Physics Letters, 103, 223902, 2013, AIP Publishing, 6 pages.

Rephaeli, Eden, Raman, Aaswath, and Fan, Shanhui, Ultrabroadband Photonic Structures to Acheive High-Performance Daytime Radiative Cooling, NANO Letters 2013, 13, pp. 1457-1461, American Chemical Society, 5 pages.

Raman, Aaswath P., Anoma, Marc Abou, Zhu, Linxiao, Rephaeli, Eden, and Fan, Shanhui, Passive Radiative Cooling Below Ambient Air Temperature Under Direct Sunlight, Nature, v. 515, Letter, Nov. 27, 2014, 11 pages.

Granqvist, C. G., Hjortsberg, A., Radiative Cooling to Low Temperatures: General Considerations and Application to Selectively Emitting SiO Films, Journal of Applied Physics, v. 52, No. 6, Jun. 1981, AIP Publishing, 17 pages.

ASTM G173-03 Reference Spectra, Feb. 2022, https://www.nrel.gov/grid/solar-resource/spectra-am1.5.html, retrieved on Mar. 2, 2022, 3 pages.

Optotherm Support-Emissivity in the Infrared, 2018, https://www.optotherm.com/emiss-table.htm, retrieved on Mar. 2, 2022, 6 pages.

Transmetra, Table of Emissivity of Various Surfaces, Feb. 2022, https://www.transmetra.ch/images/transmetra_pdf/publikationen_literatur/pyrometrie-thermografie/emissivity_table.pdf, retrieved on Mar. 2, 2022, 10 pages.

Howell, J.R., Menguc, M.P., Daun, K., Siegel, R., Thermal Radiation Heat Transfer, 5th Ed., CRC Press, 2010, pp. 21, 22, 60, and 61.

Johnson et al., "Optical Constants of the Noble Metals" Physical Review B, vol. 6, No. 12, Dec. 15, 1972, 10 pages.

Hecht, E., Optics, 4th Ed., Pearson, 2002, p. 139.

Howell, J.R., Menguc, M.P., Daun, K., Siegel, R., Thermal Radiation Heat Transfer, 7th Ed., CRC Press, 2020, p. 381.

Palik, E.D., Handbook of Optical Constants of Solids, Academic Press, 1985, pp. 350-357.

\* cited by examiner

COMPOSITE MATERIAL FOR PASSIVE RADIATIVE COOLING

PRIORITY CLAIM

This application is a continuation of U.S. application Ser. No. 15/172,304, filed Jun. 3, 2016, which claims priority under 35 U.S.C. § 119(e) to U.S. Provisional Application No. 62/170,369, filed Jun. 3, 2015, each of which is expressly incorporated by reference herein.

TECHNICAL FIELD

The present disclosure relates to passive coolers which are capable of cooling a supported article by radiation to the surrounding environment; and more particularly to a composite material for passive radiative cooling.

BACKGROUND

Radiative cooling refers to the process whereby a body will emit as radiation heat energy absorbed through normal convection and conduction processes. Generally, there is a low absorption "atmospheric window" in the region of 8-13 μm where the atmosphere is relatively transparent. A similar window exists for some wavelengths within the 1-5 μm band. Radiation from the Earth's surface within these wavelengths is likely to pass through these atmospheric windows to space rather than be absorbed by the atmosphere and returned to the Earth's surface.

For the wavelengths having high atmospheric absorption there will be significant amounts of radiation in the atmosphere as that radiation is absorbed and re-emitted back to Earth. Conversely, for the wavelengths corresponding to these atmospheric windows there will be little radiation in the atmosphere as the majority of radiation emitted by the Earth at these wavelengths is allowed to pass through the atmosphere to space.

A "selective surface" is one that exploits the atmospheric window by preferentially emitting thermal energy at wavelengths corresponding to these atmospheric windows where there is reduced incident radiation which may be absorbed by the surface, that allows rapid transfer of that radiation to space, and by that is non-absorptive of radiation outside these wavelengths.

Radiative cooling can include nighttime cooling; however, such cooling often has a relatively limited practical relevance. For instance, nighttime radiative cooling is often of limited value because nighttime has lower ambient temperatures than daytime, and therefore, there is less of a need for cooling. There is therefore a need for improvements in composite materials to passively cool terrestrial structures such as buildings, homes, electronics and other objects in both the daytime and the nighttime.

SUMMARY

In some embodiments, a composite material for passive radiative cooling is provided. In some embodiments, the composite material comprises a base layer and at least one thermally emissive layer located adjacent to a surface of the base layer. In some embodiments, the at least one emissive layer is affixed to the surface of the base layer via a binding agent.

In some embodiments, a composite material for passive radiative cooling is provided. In some embodiments, the composite material comprises a base layer and at least one thermally emissive layer located adjacent to a surface of the base layer. In some embodiments, the surface of the base layer comprises a reflective substrate comprising an adhesive layer. In some embodiments, the at least one emissive layer is affixed to the base layer via the adhesive layer of the base layer.

Other embodiments are also disclosed.

BRIEF DESCRIPTIONS OF THE DRAWINGS

DETAILED DESCRIPTION

Figure 1:
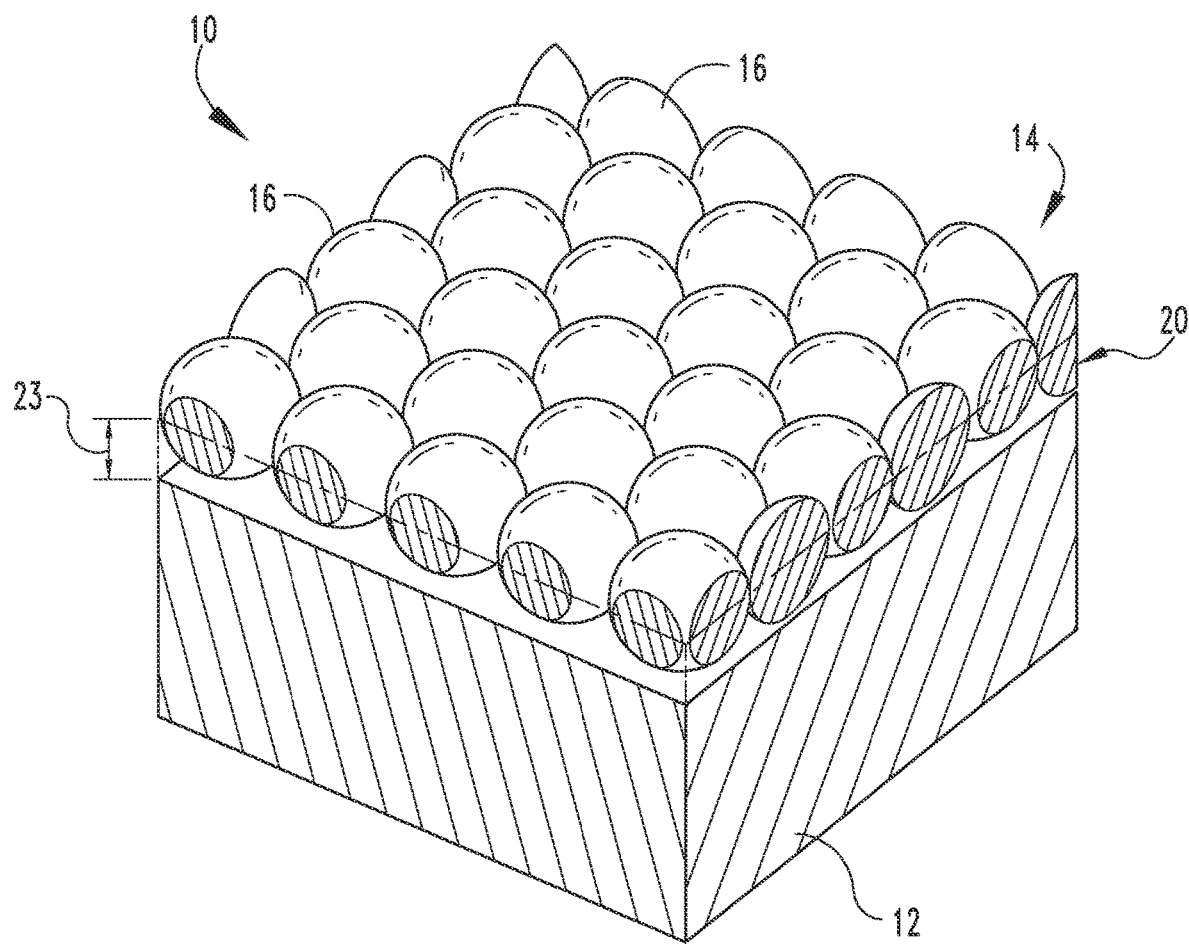
FIG. 1 illustrates a schematic cross-sectional view of a composite material for passive radiative cooling according to one embodiment of the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

To enhance the emissivity in the 8-13 μm wavelength range or in the wavelength range supported by a blackbody with temperatures in the range of 250-350° K., a composite material, generally indicated at 10 is applied to the surface of an object. This leads to the preferential emission of light in the 8-13 μm range or in the wavelength range supported by a blackbody with temperatures in the range of 250-350° K. The preferential emission of light is embodied in the emissivity spectrum.

In some embodiments, the composite material 10, as shown in FIG. 1, includes a base layer 12 composed of a reflective substrate composed of at least one of aluminum, silver, glass, polyurethane, nylon, and polyethylene fibers. In some embodiments, the reflective substrate comprises paint. In some embodiments, the paint comprises white paint. In some embodiments, the reflective substrate comprises glue. The base layer 12 may be placed in thermal contact with an object to be cooled.

Immediately above the base layer 12 is at least one emissive layer 14 in some embodiments. The at least one emissive layer 14 may be arranged in a hexagonal monolayer, square monolayer, irregular monolayer, or irregular combination of between one and ten layers; exposed to sunlight and also to the atmosphere and paths for radiating thermal energy. In an embodiment, the at least one emissive layer 14 is composed of a plurality of microparticles 16. In one embodiment, each of the plurality of microparticles 16 may be formed in a geometric shape, and composed of a silica material. For example, the at least one emissive layer 14 may include a plurality of microspheres. The plurality of microparticles 16 may also be formed in square, cylindrical, or an irregular geometric shape to name a few non-limiting examples.

Figure 2:
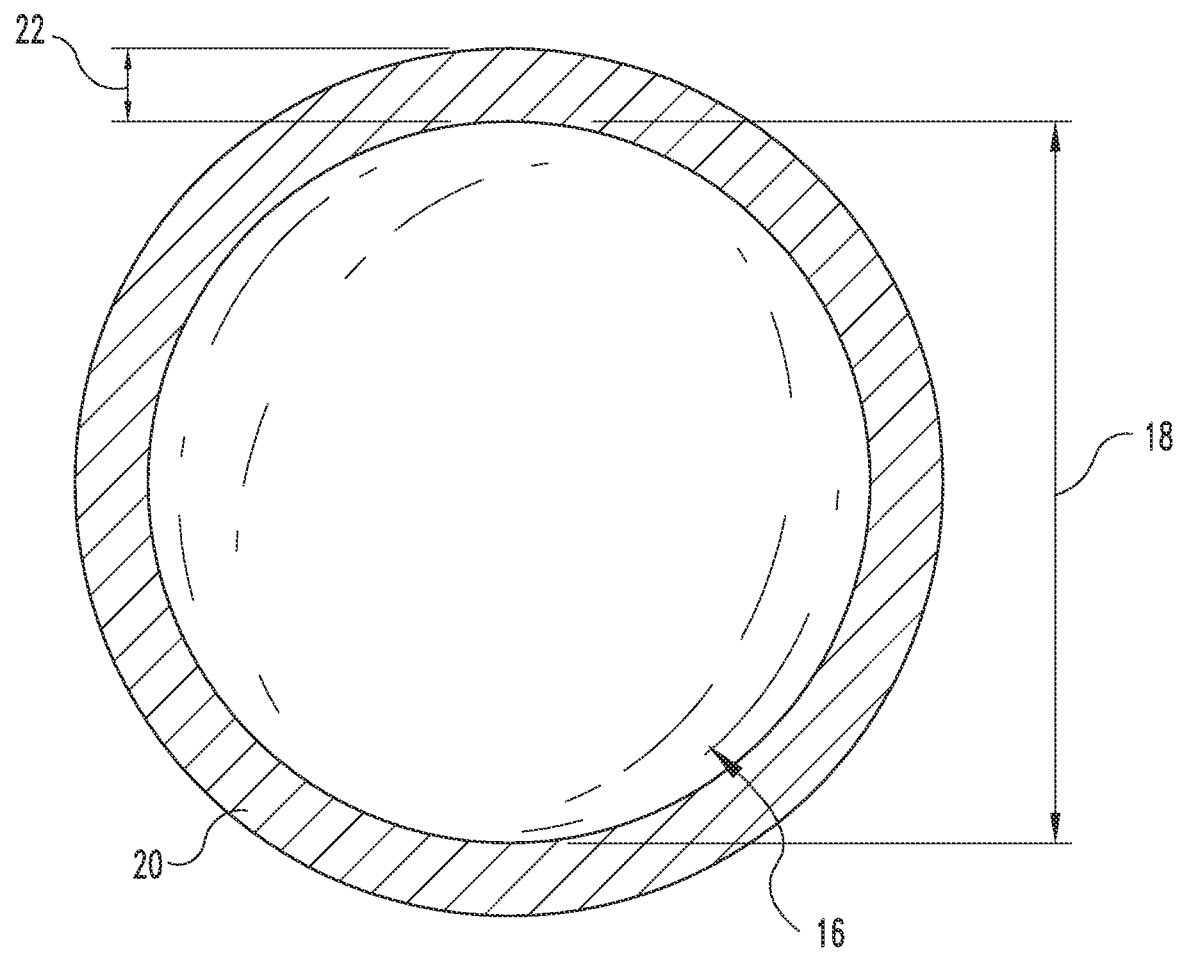
FIG. 2 illustrates a cross-sectional view of a microparticle according to one embodiment of the present disclosure.

In an embodiment, with reference to FIG. 2, each of the plurality of microparticles 16 includes a characteristic dimension 18. In one embodiment, the characteristic dimension 18 is between about 5 to about 50 microns. In another embodiment, the characteristic dimension 18 is less than 30 microns. In still another embodiment, the characteristic dimension 18 is between about 10 and about 20 microns.

In an embodiment, with reference to FIGS. 1 and 2, the at least one emissive layer 14 is bonded to the base later 12 via a binding agent 20. The binding agent 20 may be composed of a transparent, polymer material. In some embodiments, the binding agent 20 may be uniformly applied to the at least one emissive layer 14 or applied to each of the plurality of microparticles 16, as shown in FIG. 2, via an electromagnetic brush (EMB) process or other suitable process. In some embodiments, the EMB process of the present disclosure utilizes a rotating wire brush in conjunction with static electromagnetic fields to deposit the plurality of microparticles 16 to the base layer 12. In some embodiments, the EMB process requires the use of the binding agent 20 coating each of the plurality of microparticles 16 to achieve adhesion under subsequent heating. When applied to each of the plurality of microparticles 16 via an electromagnetic brush (EMB) process, the binding agent 20 may have a characteristic thickness 22 between about 1 and about 50 microns in one embodiment. The binding agent 20 is melted after application of the plurality of microparticles 16 to the emissive layer 14 to form the binding agent 20 layer illustrated in FIG. 1.

In some embodiments, a dry dusting process, rather than the EMB process, is utilized by dry dusting the plurality of microparticles 16 over the base layer 12. The dry dusting process achieves a rough approximation of the uniform thin layer using a standard powder duster or squeeze bottle filled with the plurality of microparticles 16. In some embodiments, the dry dusting process is used with the binding agent 20 coating each of the plurality of microparticles 16 to achieve adhesion under subsequent heating. In some embodiments, the dry dusting process is used when the surface of base layer 12 comprises a reflective substrate comprising an adhesive layer that will dry, creating an adhesion and surface morphology. In some embodiments, the reflective substrate is glue or paint, to name a couple of non-limiting examples. It is envisioned that any suitable reflective substrate may be employed in the dry dusting process utilized in accordance with the embodiments of the present disclosure. In some embodiments, when base layer 12 comprising an adhesive layer is utilized in the dry dusting process, use of binding agent 20 is optional.

In some embodiments, wet printing and fusing is utilized in lieu of the EMB process and dry dusting process. In some embodiments, the wet printing and fusing process uses a printer to print a liquid suspension of the plurality of microparticles 16 directly on the base layer 12. In some embodiments, the wet printing and fusing process requires subsequent heating through infrared heating or a hot roller process to cure the binding agent 20 coating each of the plurality of microparticles 16 to achieve adhesion.

In one embodiment, the binding agent 20 layer shown in FIG. 1 includes a characteristic thickness 23 between about 1 and about 50 microns in one embodiment. It will be appreciated that the characteristic thickness 23 may be greater than approximately 50 µm in other embodiments. It will further be appreciated that when the characteristic thickness 22 is larger than the characteristic dimension 18 of the plurality of microparticles 16, a smooth surface morphology is created. Additionally, a rough surface morphology is created when the characteristic thickness 23 is less than the characteristic dimension 18 of the plurality of microparticles 16.

Figure 3:
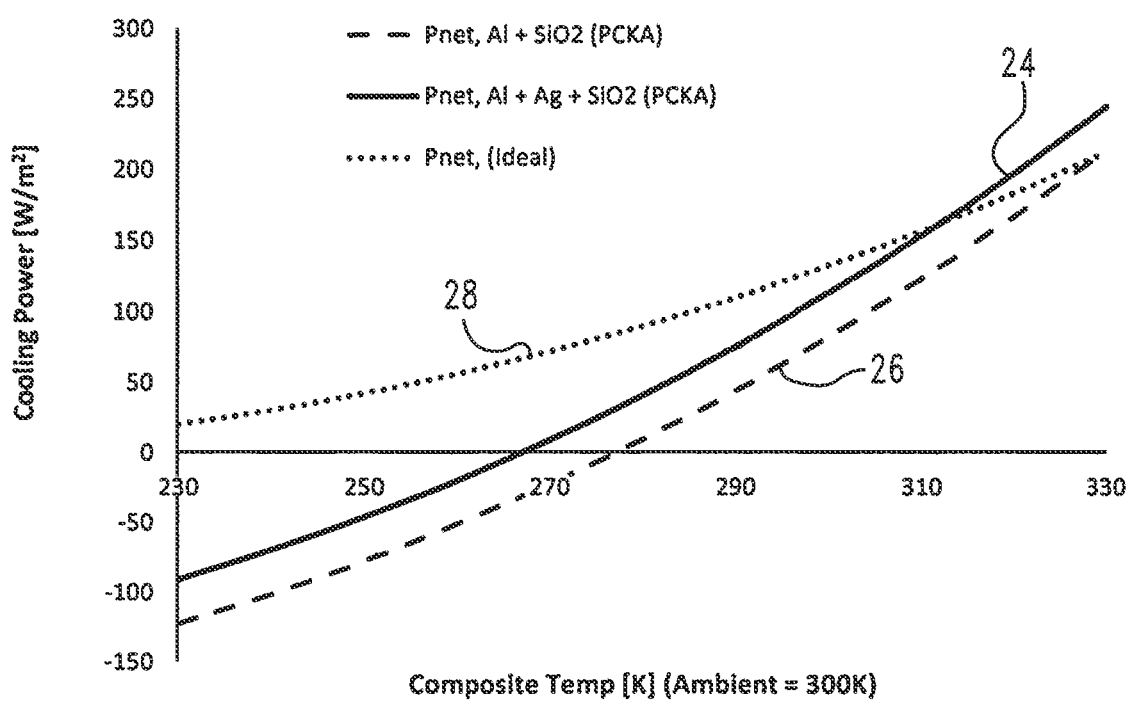
FIG. 3 illustrates a graph of a cooling potential of composite materials against ambient daytime temperatures.
Figure 4:
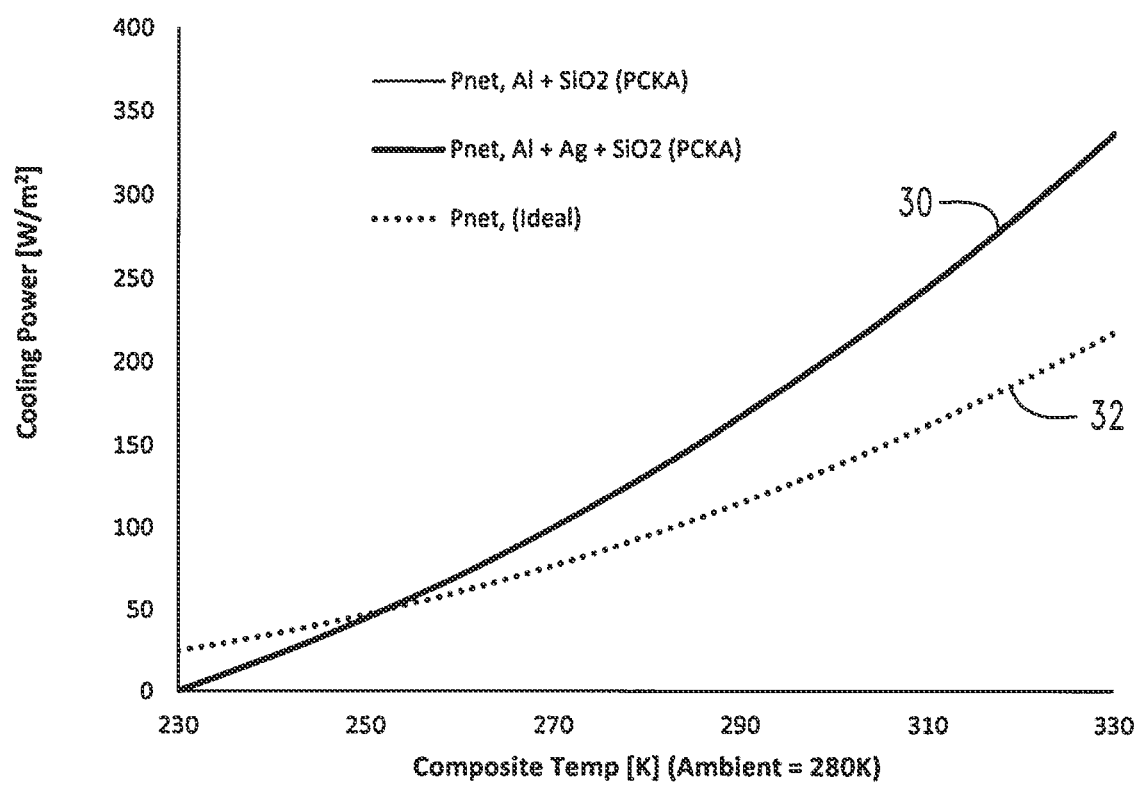
FIG. 4 illustrates a graph of a cooling potential of composite materials against ambient nighttime temperatures.

As shown in FIGS. 3 and 4, a computational study was performed to study the cooling power of a composite material 10 in one embodiment composed of an aluminum-silver-silica (SiO2) combination. The computational study of composite material 10 (shown by line 24), yielded a cooling potential of approximately 113 W/m$^2$ at an ambient temperature of approximately 300° K. when exposed to direct sunlight. The computational study also analyzed an aluminum-silica combination, shown by line 26, and yielded a cooling potential of approximately 82 W/m$^2$ at an ambient temperature of approximately 300° K. when exposed to direct sunlight. For the ideal case, the computational study assumed a fictional ideal material that is purely reflective in all bands other than 8-13 microns. In the 8-13 micron band, the ideal material is purely emitting (i.e., emissivity=1). As shown, the aluminum-silver-silica combination outperforms the ideal case, shown by line 28, above a composite temperature of approximately 310° K due to a broader emission spectrum above approximately 13 µm thereby accessing narrower atmospheric window bands in the 20 to 25 micron range.

As shown in FIG. 4, the computational study of the aluminum-silver-silica combination, shown by line 30, yields a cooling potential exceeding approximately 250 W/m$^2$ when exposed to the nighttime sky and outperforms the ideal case, line 32, above a composite temperature of 255° K. It will therefore be appreciated that the composite material 10 includes at least one thermally-emissive layer 14 bonded to a base layer 12, via a binding agent 20, where the composite material 10 produces a positive cooling potential in both daytime and nighttime ambient temperatures.

While the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

The invention claimed is:

1. A composite material for passive radiative cooling comprising:
   a reflective substrate comprising aluminum; and
   at least one thermally-emissive layer comprising a plurality of spherical silica microparticles located adjacent to a surface of the reflective substrate, wherein the at least one thermally-emissive layer is affixed to the surface of the reflective substrate via a polymer binding agent,
   wherein at least some light impinging on the thermally-emissive layer reaches the reflective substrate,
   wherein an ideal material exhibits an emissivity=1 in the frequency range of 8 micrometers to 13 micrometers, and is purely reflective at all other frequencies,
   wherein the composite material provides positive radiative cooling power when exposed to direct sunlight at an ambient temperature of 300 Kelvin, when an equilibrium temperature of the composite material is above 280 Kelvin,
   wherein the composite material provides radiative cooling power in excess of the ideal material when exposed to direct sunlight at an ambient temperature of 300 Kelvin, when the equilibrium temperature of the composite material is between 320 and 330 Kelvin, and
   wherein each of the plurality of microparticles includes a diameter greater than or equal to 5 µm and less than or equal to 30 µm.

2. The composite material of claim 1, wherein the binding agent is transparent.

3. The composite material of claim 1, wherein the binding agent includes a thickness less than or equal to approximately 50 µm.

4. The composite material of claim 1, wherein the reflective substrate further comprises silver.

5. The composite material of claim 4, wherein the binding agent is transparent.

6. The composite material of claim 4, wherein the binding agent includes a thickness less than or equal to approximately 50 µm.

7. A composite material for passive radiative cooling comprising:
   a reflective substrate comprising aluminum; and
   at least one thermally-emissive layer comprising a plurality of spherical silica microparticles located adjacent to a surface of the reflective substrate, wherein the at least one thermally-emissive layer is affixed to the surface of the reflective substrate via a polymer binding agent,
   wherein at least some light impinging on the thermally-emissive layer reaches the reflective substrate,
   wherein an ideal material exhibits an emissivity=1 in the frequency range of 8 micrometers to 13 micrometers, and is purely reflective at all other frequencies,
   wherein the composite material provides radiative cooling power in excess of the ideal material when the composite material is exposed to a nighttime sky at an ambient temperature of 280 Kelvin, when an equilibrium temperature of the composite material is above 255 Kelvin, and
   wherein each of the plurality of microparticles includes a diameter greater than or equal to 5 µm and less than or equal to 30 µm.

8. The composite material of claim 7, wherein the binding agent is transparent.

9. The composite material of claim 7, wherein the binding agent includes a thickness less than or equal to approximately 50 µm.

10. The composite material of claim 7, wherein the reflective substrate further comprises silver.

11. The composite material of claim 10, wherein the binding agent is transparent.

12. The composite material of claim 10, wherein the binding agent includes a thickness less than or equal to approximately 50 µm.

* * * * *